United States Patent
Cheng et al.

(10) Patent No.: US 10,224,322 B2
(45) Date of Patent: Mar. 5, 2019

(54) SEMICONDUCTOR DEVICE

(71) Applicant: DENSO CORPORATION, Kariya, Aichi-pref. (JP)

(72) Inventors: Weitao Cheng, Kariya (JP); Shigeki Takahashi, Kariya (JP); Masakiyo Sumitomo, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/578,318

(22) PCT Filed: Jul. 22, 2016

(86) PCT No.: PCT/JP2016/071518
§ 371 (c)(1),
(2) Date: Nov. 30, 2017

(87) PCT Pub. No.: WO2017/038296
PCT Pub. Date: Mar. 9, 2017

(65) Prior Publication Data
US 2018/0151558 A1    May 31, 2018

(30) Foreign Application Priority Data
Sep. 3, 2015 (JP) .................... 2015-174091

(51) Int. Cl.
*H01L 27/06* (2006.01)
*H01L 21/8234* (2006.01)
(Continued)

(52) U.S. Cl.
CPC ...... *H01L 27/0664* (2013.01); *H01L 21/8234* (2013.01); *H01L 27/04* (2013.01);
(Continued)

(58) Field of Classification Search
CPC ............ H01L 29/0696; H01L 29/7395; H01L 29/7397; H01L 27/0761
See application file for complete search history.

(56) References Cited

U.S. PATENT DOCUMENTS

| | | | |
|---|---|---|---|
| 2007/0001263 A1* | 1/2007 | Nakagawa | H01L 29/0696 257/565 |
| 2009/0001411 A1 | 1/2009 | Tokura et al. | |
| 2010/0156506 A1 | 6/2010 | Tsuzuki et al. | |
| 2012/0056241 A1* | 3/2012 | Sumitomo | H01L 29/0619 257/139 |
| 2012/0056242 A1 | 3/2012 | Tsuzuki et al. | |
| 2014/0070266 A1* | 3/2014 | Matsudai | H01L 29/7397 257/139 |

(Continued)

FOREIGN PATENT DOCUMENTS

| JP | 2008-004866 A | 1/2008 |
|---|---|---|
| JP | 2013-008779 A | 1/2013 |

(Continued)

*Primary Examiner* — Frederick B Hargrove
(74) *Attorney, Agent, or Firm* — Posz Law Group, PLC (57) ABSTRACT

A semiconductor device includes a diode provided with: a drift layer being a first conductivity type; a cathode region being provided in a back face side of the drift layer and being the first conductivity type; a second conductivity type region provided in a surface layer part of the drift layer; multiple trenches dividing the second conductivity type region into pieces by being provided deeper than the second conductivity type region, and configuring an anode region; a gate insulation film provided in a surface of the trench; a gate electrode provided in a surface of the gate insulation film; an upper electrode electrically connected with the anode region; and a lower electrode electrically connected with the cathode region. A width between the trenches is narrowest in the drift layer is defined as a mesa width. The mesa width is set to be equal to or greater than 0.3 µm.

8 Claims, 8 Drawing Sheets

(51) Int. Cl.
   *H01L 29/739* (2006.01)
   *H01L 27/04* (2006.01)
   *H01L 27/088* (2006.01)
   *H01L 29/06* (2006.01)
   *H01L 29/10* (2006.01)
   *H01L 29/423* (2006.01)
   *H01L 29/861* (2006.01)
   *H01L 29/40* (2006.01)

(52) U.S. Cl.
   CPC ............ *H01L 27/06* (2013.01); *H01L 27/088* (2013.01); *H01L 29/0657* (2013.01); *H01L 29/0696* (2013.01); *H01L 29/1095* (2013.01); *H01L 29/407* (2013.01); *H01L 29/4236* (2013.01); *H01L 29/739* (2013.01); *H01L 29/7397* (2013.01); *H01L 29/8613* (2013.01)

(56) References Cited

U.S. PATENT DOCUMENTS

| | | | |
|---|---|---|---|
| 2014/0084335 A1* | 3/2014 | Senoo | H01L 29/0834 257/140 |
| 2015/0115314 A1 | 4/2015 | Arakawa et al. | |
| 2015/0115316 A1 | 4/2015 | Oyama et al. | |
| 2015/0155277 A1* | 6/2015 | Ogura | H01L 27/0761 257/140 |
| 2017/0025410 A1* | 1/2017 | Cheng | H01L 27/0727 |

FOREIGN PATENT DOCUMENTS

| | | | | |
|---|---|---|---|---|
| JP | 2013-149909 A | | 8/2013 | |
| JP | WO 2015093038 A1 * | | 6/2015 | ......... H01L 27/0727 |

* cited by examiner

SEMICONDUCTOR DEVICE

CROSS REFERENCE TO RELATED APPLICATIONS

This application is a U.S. national stage of International Patent Application No. PCT/JP2016/071518 filed on Jul. 22, 2016 and is based on Japanese Patent Application No. 2015-174091 filed on Sep. 09, 2015, the disclosures of which are incorporated herein by reference.

TECHNICAL FIELD

The present disclosure relates to a semiconductor device including a diode, and in particular, relates to a semiconductor device in which an insulation gate type effect transistor (hereinafter referred to as IGBT) and a free wheel diode (hereinafter referred to as FWD) together are provided on a single substrate.

BACKGROUND ART

Conventionally, a semiconductor device that includes a reverse conducting (RC)—IGBT structure in which IGBT and FWD together are provided to a single chip has been proposed (for example, see a patent literature 1). In the RC-IGBT structure, IGBT is configured from a trench gate structure, and FWD is positioned between the trench gates. A width of the narrowest part between the trench gates in IGBT (hereinafter referred to as a mesa width) is set to be equal to a mesa width in FWD.

However, by a recent miniaturization and an introduction of the RC-IGBT structure with a narrowed mesa width IGBT in which the mesa width is reduced, when the mesa width of FWD is reduced to match to the mesa width of IGBT, it is observed that a diode characteristic of FWD changes sharply. In other words, it is observed that, in a case that the diode is configured between the trench gates, when the mesa width is too reduced, it may be difficult to perform a characteristic control and a variation suppression.

PRIOR ART LITERATURES

Patent Literature

Patent Literature 1: JP 2013-235891 A

SUMMARY OF INVENTION

It is an object of the present disclosure to provide a semiconductor device having a diode that easily performing a characteristic control and a variation suppression.

According to one aspect of the present disclosure, a semiconductor device has a diode including a drift layer being a first conductivity type, a cathode region being the first conductivity type, a second conductivity type region, multiple trenches, a gate insulation film, a gate electrode, an upper electrode, and a lower electrode. The cathode region is provided in a back face side of the drift layer. The second conductivity type region is provided in a surface layer of the front side of the drift layer. Multiple trenches divide the second conductivity type region into multiple pieces by being provided deeper than the second conductivity type region, and configure an anode region by the second conductivity type region. The gate insulation firm is provided in the surface of the trench. The gate electrode is provided in the surface of the gate insulation film. The upper electrode is electrically connected with the anode region. The lower electrode is electrically connected with the cathode region. The width of a part where a distance between the multiple trenches is narrowest in the drift layer is defined as a mesa width, and the mesa width is set to be equal to or greater than 0.3 µm.

In the semiconductor device, the mesa width of the diode is set to be equal to or greater than 0.3 µm. It may be possible to easily perform the characteristic control and the variation suppression and to achieve a substantially constant diode characteristic.

According to another aspect of the present disclosure, a semiconductor device includes structure in which the IGBT where a vertical type IGBT is provided and a diode part where a diode is provided, the diode part being provided along the IGBT part, are provided together into a single chip. The semiconductor device includes a drift layer having first conductivity type, a corrector region having the second conductivity type, a cathode region having the first conductivity type, a second conductivity type region, multiple trenches, an emitter region having the first conductivity type, a gate insulation film, a gate electrode, an upper electrode, and a lower electrode.

In the IGBT part, the corrector region is provided in the back face side of the drift layer. In the diode part, the cathode region is provided in the back face side of the drift layer. In the surface part of the front face side of the drift layer, the second electrode region is provided in both the IGBT part and the diode part. Multiple trenches are provided to be arranged in the IGBT part and in the diode part, by being provided deeper than the second conductivity type region to divide the second conductivity type region into a plurality of pieces, configure a channel region by at least part of the second conductivity type region in the IGBT part, and configure an anode region by the second conductivity type region in the IGBT part. In the IGBT part, the emitter region is provided along the side face of the trench in the surface part of the channel region. The gate insulation film is provided in the surface of the trench. The gate electrode is provided in the surface of the gate insulation film. In the IGBT part, the upper electrode is electrically connected with the second conductivity region and the anode region. The lower electrode is electrically connected with the corrector region in the IGBT part and the cathode region, in the diode part. The width of a part where a distance between the multiple trenches is narrowest in the drift layer of the diode part is defined as a mesa width. The mesa width is set to be equal to or greater than 0.3 µm.

In the semiconductor device, the mesa width is set to be equal to or more than 0.3 µm. Therefore, it may be possible to perform the characteristic control and the variation suppression and to achieve the substantially constant diode characteristic.

BRIEF DESCRIPTION OF DRAWINGS

The above and other aspects, features and advantages of the present disclosure will become more apparent from the following detailed description made with reference to the accompanying drawings. In the drawings.

DESCRIPTION OF EMBODIMENTS

An embodiment of the present disclosure will be explained with reference to the drawings. In each of the embodiments, a part, which is identical or similar to each other, will be explained by attaching identical numerals.

(First Embodiment)

Figure 1:
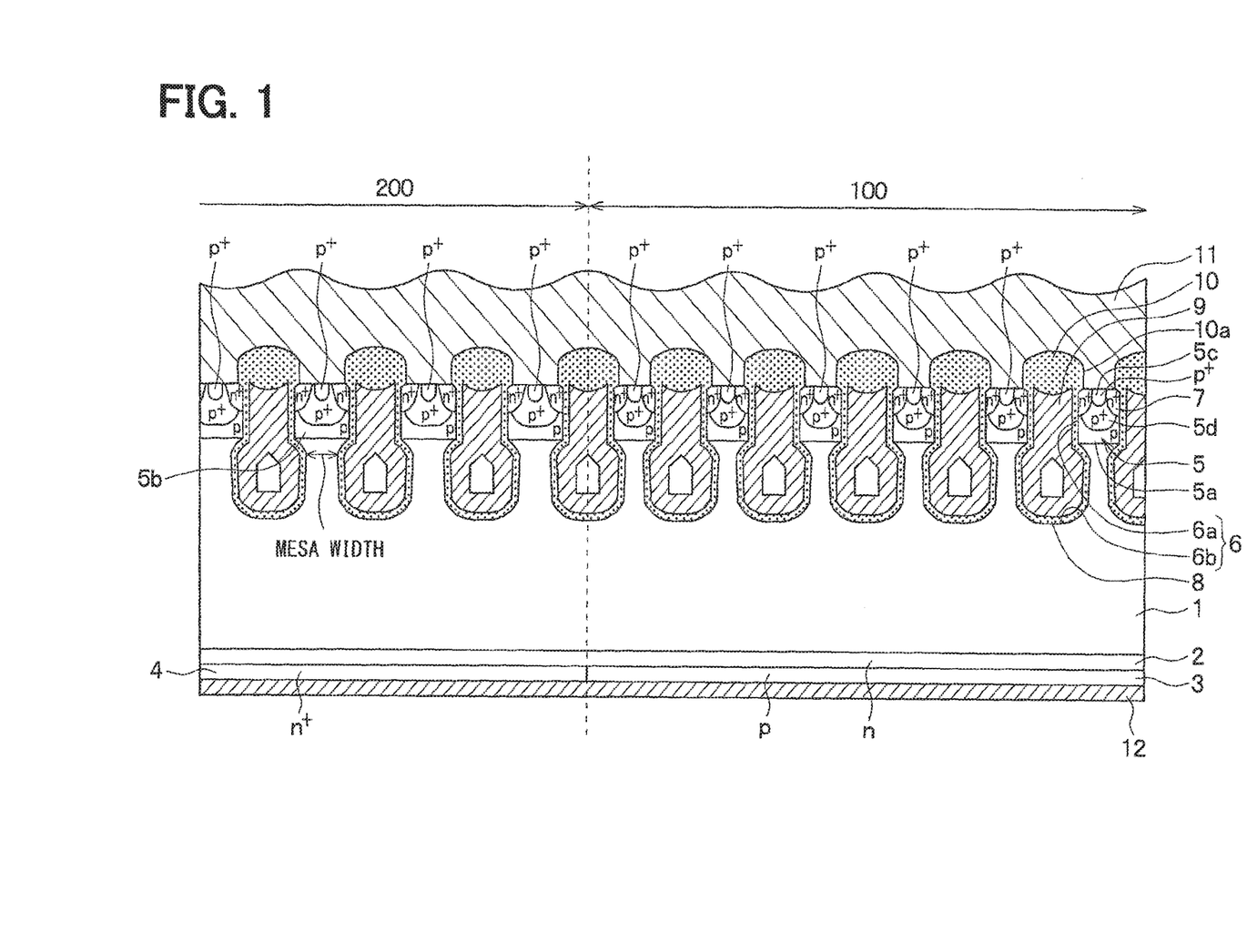
FIG. 1 is a sectional view illustrating of a semiconductor device of RC-IGBT structure according to a first embodiment of the present disclosure.

A first embodiment of the present disclosure will be explained. As shown in FIG. 1, a semiconductor device according to the present embodiment is configured from RC-IGBT structure in which FWD and a vertical type IGBT passing a current in a substrate thickness direction are installed on a single substrate. In particular, the semiconductor device according to the embodiment is configured as follow.

As shown in FIG. 1, the semiconductor device according to the embodiment includes an IGBT part 100 and a FWD part 200. In the IGBT part 100, IGBT is installed. The FWD part 200 is installed along the IGBT part 100, and FWD is provided in the FWD part 200. The IGBT part 100 and the FWD part 200, for example, are provided in a central cell region of a chip. The semiconductor device includes an outer pressure-proof part that is not illustrated to a circumference of the cell region, in other words, a circumference part of the chip.

IGBT and FWD are provided from the semiconductor device that configures an $n^+$ type drift layer 1. In the IGBT part 100 and the FWD part 200, a field stop (herein after referred to as FS) layer 2 is provided from an n type layer in a surface part of the $n^+$ type drift layer 1 in a back face side of the $n^+$ type drift layer 1. The FS layer 2 is provided from the back face of the $n^+$ type drift layer 1 to a predetermined position that is relatively shallow. The FS layer 2 is configured by injection of an n type impurity such as phosphorus (P). An Impurity concentration and a diffusion depth of the FS layer 2 are set according to a required characteristic of IGBT and FWD.

In the IGBT part 100, the surface part of the FS layer 2 includes a collector region 3 provided by a $p^+$ type impurity layer. The collector region 3 is provided by injection of a p type impurity such as boron. In the FWD part 200, the surface part of the FS layer 2 includes a cathode region 4 provided in the $n^+$ type impurity layer. The cathode region 4 is provided by injection of an n type impurity such as phosphorus. The impurity concentration and the diffusion depth of the collector region 3 and the cathode region 4 are set according to the required characteristic of IGBT and FWD.

Furthermore, in both of the IGBT part 100 and the FWD part 200, a p type region 5 is provided in the surface part of a front face side of an n+ type drift layer 1. The multiple trenches 6 to provide trench gates are provided so as to pass through the p type region 5 and to reach the n+ type drift layer 1. The p type region 5 is separated into multiple parts by a trench 6.

In the embodiment, the trench 6 is configured from a trench provided in the IGBT part 100 and a trench provided in the FWD part 200. The trench 6 in the IGBT part 100 and the trench 6 in the FWD part 200, each of which are multiple, are provided at different pitch (distances). In particular, in the case of the embodiment, a shape of the trench 6 is same in the IGBT part 100 and in the FWD part. A pitch of the FWD part 200 is greater than a pitch of the IGBT part 100 where the trench 6 is placed. Each of the trenches 6 is extended in a perpendicular direction on a sheet of FIG. 1, each of the trenches 6 have a stripe structure by being extended in a parallel, or a cyclic structure with a tip part pulled around after being extended in parallel. In case of the cyclic structure, for example, is as a multiple cyclic structure in a single pair of multiple of trenches 6.

Each of the trenches 6 includes a first trench 6a corresponding to an inlet opening side configured in a p type region 5. Each of the trenches 6 includes a second trench 6b that communicates with the first trench 6a and reaches the n+ type drift layer 1 from the vicinity of boundary between the p type region 5 and the $n^+$ type drift layer 1.

The second trench 6b includes, in a sectional view of FIG. 1, a part where an opening width, in other words, the distance of an opposite side wall (a length in right and left directions of FIG. 1), is greater than the opening distance of the first trench 6a. For example, a sectional shape is made to an oval shape or an elliptical shape. In other words, in the second trench 6b, at least a part of a bottom part or the side wall is positioned in the $n^+$ type drift layer 1. They make a rounded shape (a shape including a curvature). The trench 6 is provided as a pot shape in the sectional view as shown in FIG. 1.

Therefore, in the trenches 6 that are adjacent to each other, a distance of a shortest part between the trenches 6b adjacent to each other is shorter than the distance of the first trench 6a. The distance of the shortest part between the trenches 6b adjacent to each other is called as a mesa width. In the embodiment, the mesa width in the IGBT part 100 is set to be less than 0.3 μm and the mesa width in the FWD part 200 is set to be equal to or more than 0.3 μm. In other words, when the mesa width in the IGBT part 100 is different from the mesa width in the FWD part 200, the mesa width in the FWD part 200 is greater than the mesa width in the IGBT part 100.

The part provided in the IGBT part 100 in the p type region 5 separated into multiple parts by the trench 6 become a channel p type region 5a, the p type region 5a which configures a channel region. An emitter region 7 configured by the n+ type impurity layer is provided in the surface part of the channel p type region 5a.

In the surface part of a channel p type region 5a in the p type region 5, in particular, a distance between the emitter regions 7 positioned in both sides of the channel p type region 5a, the body p type region 5d having a high concentration body and being largely extended is provided so as to enclose the contact part 5c of the channel p type region 5a. In the IGBT part 100, a surface concentration of a p type impurity concentration of the p type region 5 is configured to be a high concentration.

The emitter region 7 is configured from the high impurity concentration more than the n+ type drift layer 1, and is terminated inside the p type region 5, and also is positioned to contact with the side face of the first trench 6a. In particular, the emitter region 7 is extended into a stick shape along the longitudinal direction of the trench 6, and is terminated more inside than the tip of the trench 6.

The trench 6, the second trench 6b in more particular, is provided deeper than the p type region 5, and is positioned in a particular pitch in a sectional face of FIG. 1. In each of the trench 6, a gate insulation film 8 covering an inside wall surface of each trench 6 and a gate electrode 9 configured from a doped Poly-Si or the like provided in the surface of the gate insulation firm 8 are embedded. FIG. 1 illustrates that a hole is provided at a center of the part positioned in the second trench 6b of the gate electrode 9. The hole may be not included. The trench 6 may include the structure embedded completely by the gate electrode 9. The gate electrode 9 provided in the IGBT part 100 is electrically connected with each other in a different sectional view from FIG. 1. In the gate electrode 9, a gate voltage of an equal electric potential is applied.

Furthermore, the emitter region 7 and the channel p type region 5a are electrically connected with an upper electrode 11 that configures a emitter electrode through a contact hole 10a provided in a layer insulation film 10. As not illustrated, a passivation film is provided to protect the upper electrode 11 and a wire, or the like. IGBT is configured so that a lower electrode 12 is provided to the back face side of the collector region 3 to configure a collector electrode.

The part configured in the FWD part 200 in the p type region 5 separated into multiple parts by the trench 6 is an anode region 5b. The contact region is configured so that the surface part has a relatively high concentration. The upper electrode 11 is also extended to the FWD part 200. The upper electrode 11 has ohmic connection with the anode region 5b and functions as the anode electrode. Furthermore, the lower electrode 12 is also extended to the FWD part 200. The lower electrode 12 has ohmic connection with the cathode region 4 and functions as the cathode electrode. According to this configuration, FWD is configured with the configuration.

In FIG. 1, in the FWD part 200, the structure between the trenches 6 is configured as same as the structure in the IGBT part 100, and the contact part 5c and a body p type region 5d are provided. Though the surface part of the anode region 5b has the relatively high concentration, it may be used only either of them. Though the emitter region 7 is configured to contact with the side face of the trench 6, in the FWD part 200, the emitter region 7 may be eliminated.

In the way, the semiconductor device with IGBT and FWD according to the embodiment is configured. The semiconductor device with the configuration can be produced by the manufacturing method of the semiconductor device with the RC-IGBT structure, which is conventionally known. In regard to a manufacturing method of the trench 6, for example, the trench including the second trench 6b whose opening width is greater than the width of the first trench 6a is configured by using the way shown in JP 2013-214696 A. In other words, after the first trench 6a is provided, the second trench 6b is provided in a state that the side face of the first trench 6a is covered with a protect film. The width of the second trench 6b is greater than the width of the first trench 6a by an etching in a lateral direction. The trench 6 like the shape according to the embodiment is provided by an etching way like that.

The semiconductor device of the RC-IGBT structure in which the IGBT and FWD together are provided to a single chip performs an operation as same as the operation that a general semiconductor device with IGBT and FWD performs. IGBT performs the operation as follow since the semiconductor device of the IGBT includes the trench gate of IGBT provided as the pot shape.

In the first, it is explained about On-state. When a predetermined voltage (for example, 15V) is applied to the gate electrode 9, an inversion layer is provided since a part of the channel p type region 5a contacting with the trench 6 becomes an n type partially. The electron is supplied from the emitter region 7 through the reverse layer to the n+ type drift layer 1, and a positive hole is supplied from the corrector region 3 to the n+ type drift layer 1. According to a conductivity modulation, the resistance value of the n+ type drift layer 1 decreases to be the On-state.

Then, the distance of the shortest part between the second trenches 6b, which are adjacent each other, is shorter than the distance between first trenches 6a, which is adjacent. Accordingly, compared to a case that the distance between trenches 6, which is adjacent, is constant at the distance of the first trenches 6a, which is adjacent, the positive hole supplied to the n+ type drift layer 1 is difficult to pull out through the channel p type region 5a. Therefore, it may be possible that the n+ type drift layer 1 store a lot of the positive hole. Since a total of the electron supplied to the n+ type drift layer 1 increase, it may be possible to reduce On-resistance.

It is explained about Off-state. When the gate electrode 9 is applied a predetermined voltage (for example, 0V), the inversion layer provided in the channel p type region 5a disappears. When the electron is not supplied from the emitter region 7, the positive hole is not supplied from the corrector region 3. The positive hole accumulated in the n$^+$ type drift layer 1 pulls out from the upper electrode 11 through the channel p type region 5a.

In the semiconductor device, the mesa width of IGBT the part 100 is set to be different from the width of the FWD part 200, and the mesa width of at least the FWD part 200 is set to be equal to or more than 0.3 µm.

Figure 2:
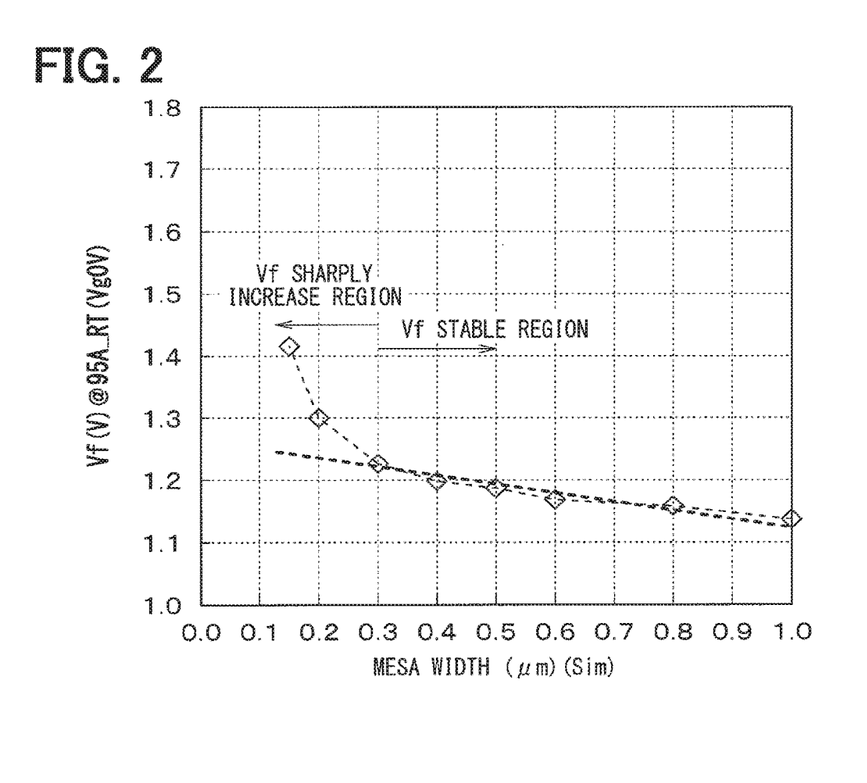
FIG. 2 is a diagram showing a result of a survey regarding to a relation between the mesa width of FWD and Vf.

When the mesa width of the FWD part 200 is reduced in accordance with the mesa width of the IGBT part 100, it is observed that the diode characteristic of FWD is changed sharply. In particular as shown in FIG. 2, according to Sim, an experimental result is achieved. The experimental result includes that, in the case that the mesa width is equal to or more than 0.3 µm, the forward voltage (Vf) characteristic is almost constant when the gate voltage=0. The experimental result includes that, in the case that the mesa width is less than 0.3 µm, the Vf increases sharply. In other words, in the case that the FWD is configured within the trench gate whose structure is as same as the IGBT part 100, it is observed that it is difficult to perform the characteristic control and the variation suppression when the mesa width is too reduced.

Figure 3A:
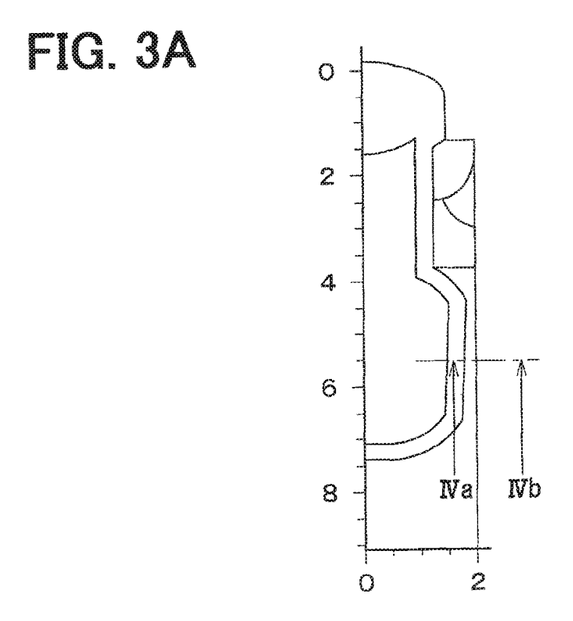
FIG. 3A is a diagram illustrating a sectional model of FWD that is referenced when a relation between a central line of the trench in a direction of the mesa width and a hole density is studied while equalizing a pitch and shape of the trench.
Figure 3B:
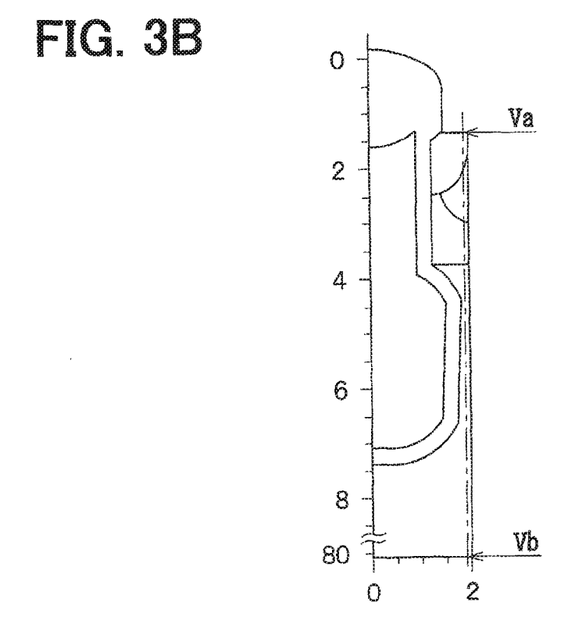
FIG. 3B is a diagram illustrating a sectional model of FWD that is referenced when a relation between a distance from a surface (a contact part to an upper electrode) of the trench in a depth direction of trench and the hole density.
Figure 4:
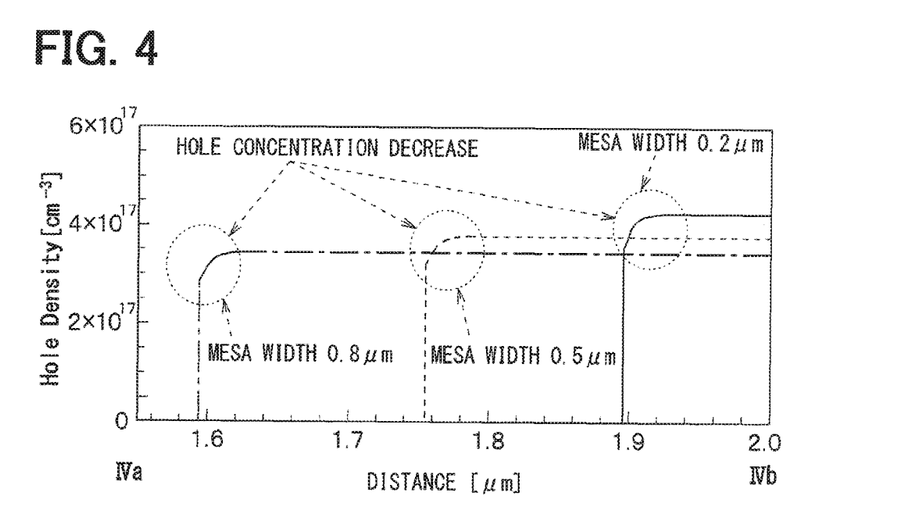
FIG. 4 is a diagram showing a result of a survey that regarding to a relation between a distance from a central line of a trench in IVa-IVb sectional view of FIG. 3A, as If=100 A, and the hole density, when the mesa width is changed.
Figure 5:
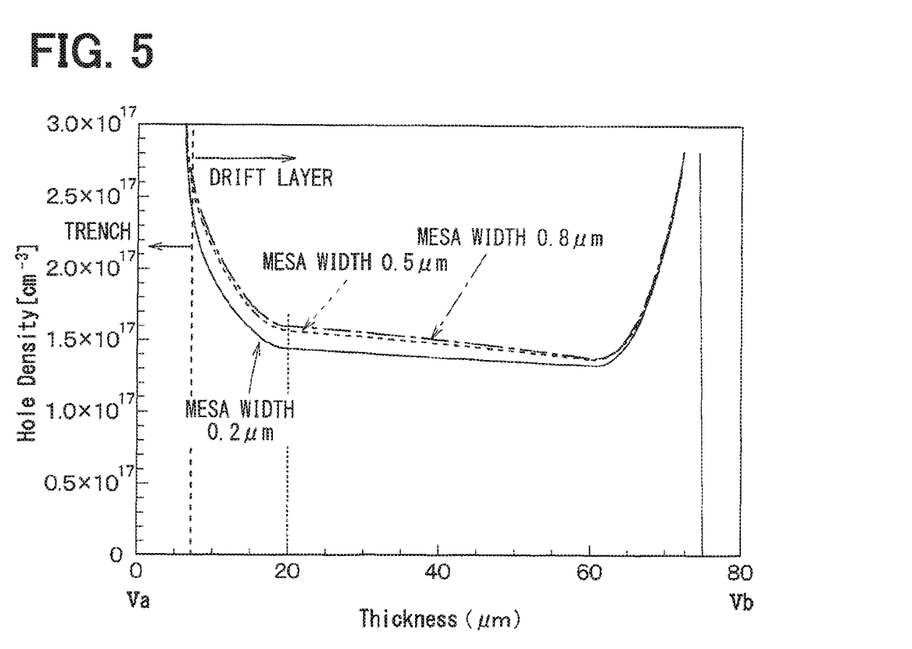
FIG. 5 is a diagram showing a result of a survey that regarding to a relation between a distance from a surface of FWD in IVa-IVb sectional view of FIG. 3B, as If=100 A, and the hole density, when the mesa width is changed.

A hole concentration distribution of a mesa part between the second trenches 6b with distance narrowed between the trenches 6 has been studied when the mesa width in FWD is changed as 0.2, 0.5 and 0.8 µm. In particular, the hole concentration within an IVa-IVb of FIG. 3A, in other words, a vertical direction of the substrate has been studied. The hole concentration within a Va-Vb of FIG. 3B, in other words, a lateral direction of the substrate has been studied. FIG. 4 and FIG. 5 illustrate results. In FIG. 4, the part that the hole concentration decreases corresponds to the side face of the trench 6.

Regarding the hole concentration distribution in the lateral direction of the substrate as shown in FIG. 4, the peak value of the hole concentration, changes according to the change of the mesa width. As the mesa width is reduced, the peak value of the hole concentration increases. Since the mesa width is narrow, the hole concentration of all region in the trenches 6, which is adjacent, is low when the hole concentration becomes high. Therefore, the current becomes difficult to flow, and On-resistance increases. In a position deeper than the bottom part of the trench 6, in the case that the mesa width is equal to 0.2 μm, the hole concentration is low. In the case that the mesa width is equal to 0.5 μm or 0.8 μm, the hole concentration is almost equal. It is confirmed that it is difficult to flow the current when the mesa width is less than 0.3 μm such as a case of 0.2 μm.

By contrast, in the embodiment, the mesa width of at least the FWD part 200 is set to be equal to or more than 0.3 μm. It may be possible to perform the characteristic control and the variation suppression, and achieve a constant diode characteristic as FWD.

When the mesa width of the IGBT part 100 is reduced by the miniaturization, it may be possible to make FWD, which easily performs the characteristic control and the variation suppression by setting the mesa width of the FWD part 200 to be equal to or more than 0.3 μm.

Figure 6:
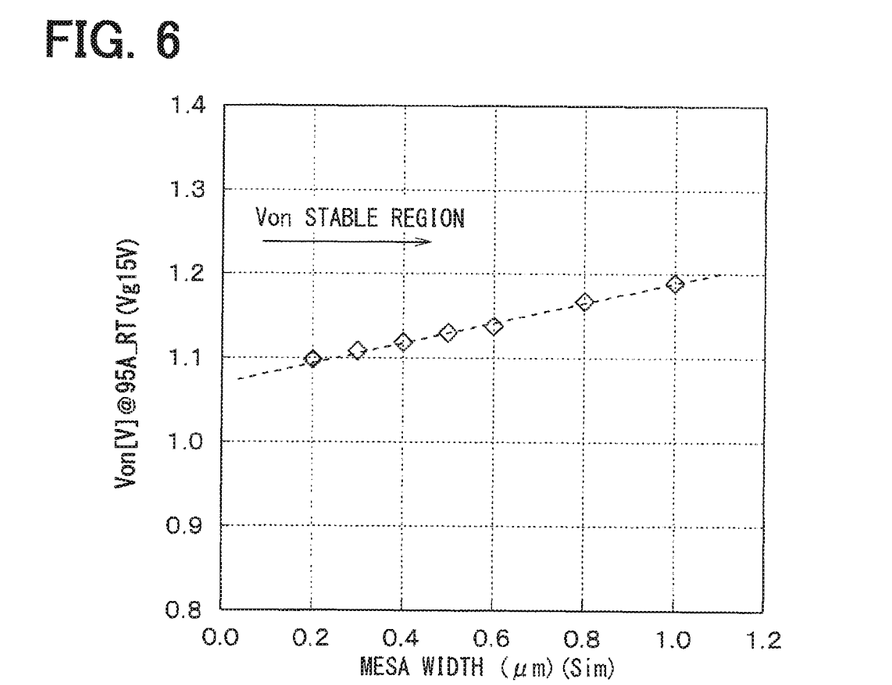
FIG. 6 is a diagram showing a relation between the mesa width of IGBT and On-voltage Von.

In the IGBT part 100, when an On-voltage Von has been studied in a condition where the gate voltage=15V. As shown in FIG. 6, when the mesa width is reduced, the change of the On-voltage Von is small. Therefore, it may be possible to achieve an On-resistance characteristic even if the mesa width is reduced by the miniaturization.

(Second Embodiment)

A second embodiment of the present disclosure will be explained.

The present embodiment includes change of the shape of the trench 6 according to the first embodiment. The others of the embodiment are same as the first embodiment. Therefore, only a part different from the first embodiment will be explained.

Figure 7:
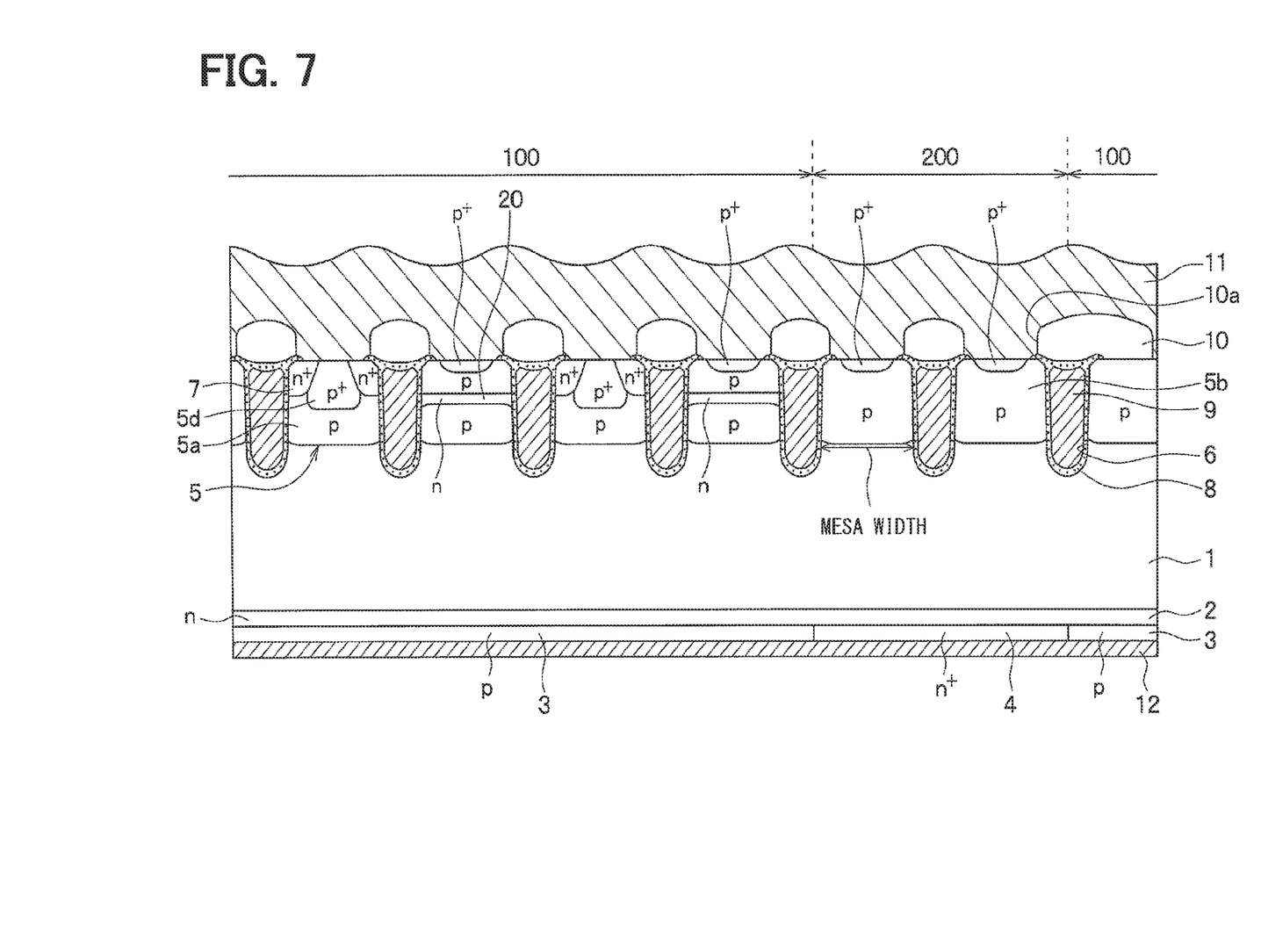
FIG. 7 is a sectional view illustrating of the semiconductor device of RC-IGBT structure according to a second embodiment of the present disclosure.

As shown in FIG. 7, in the present embodiment, the width of the trench 6 is substantially constant from the inlet opening to the bottom part. In the present embodiment, the opening width does not largely change like the first trench 6a of the first embodiment and the second trench 6b of the first embodiment.

In the IGBT part 100, a part of the p type region 5 separated into multiple parts by the trench 6 is the channel p type region 5a. The remaining part corresponds to the anode region 5b. FWD is configured inside the IGBT part 100. FWD configured in the IGBT part 100 includes a hole injection stopper layer (hereinafter, referred to as a hole stopper layer, HS layer) positioned at an intermediate position corresponding to a depth direction of the anode region 5b. According to the configuration, it may be possible to reduce the hole injected through the FWD part 200 during the operation of IGBT. Accordingly, it may be possible to reduce a hole quantity that needs to be pulled out at the time Off of IGBT. Upon turning IGBT off, when a corrector current Ic is equal to 0, the amount of projection at that time of an overshoot while being below 0 reduces. Therefore, it may be possible to reduce AC loss at that time of switching.

In the semiconductor device including the structure, the width that is the narrowest width between the trenches 6 in the FWD part 200, in particular, the width that is the narrowest width in the part in which, the n+ type drift layer 1 exists is, defined as the mesa width. The mesa width is set to be equal to or more than 0.3 μm. In regard to the IGBT part 100, aside from the FWD part 200, it is set that the mesa width corresponding to the miniaturization, for example, is less than 0.3 μm.

When the opening width of the trench 6 is almost constant, it may be possible to achieve the same effect as the first embodiment since the mesa width of the FWD part 200 is equal to or more than 0.3 μm.

(Third Embodiment)

A third embodiment of the present disclosure will be explained. The present embodiment includes change of the configuration of the trench 6 according to the first embodiment. The others of the embodiment are same as the first embodiment. Therefore, only a part different from the first embodiment will be explained.

Figure 8:
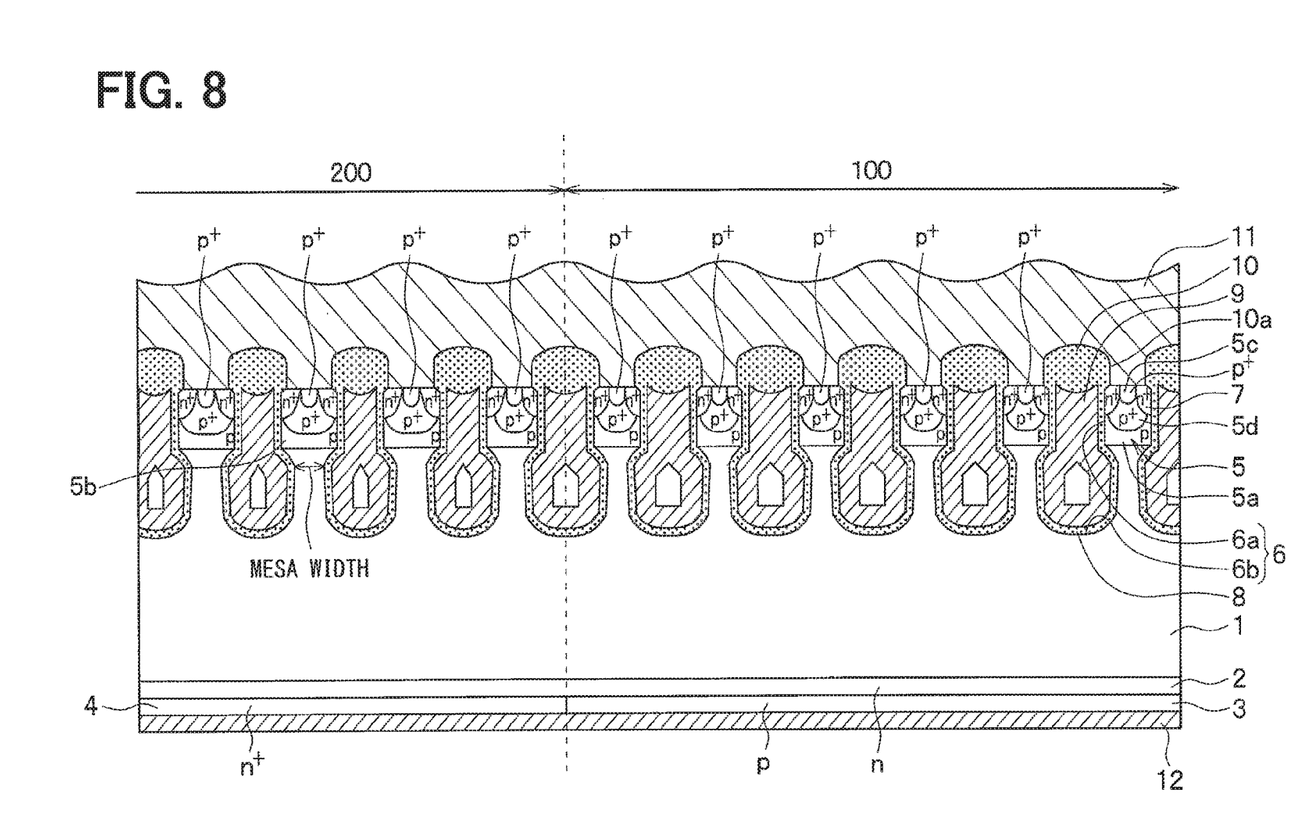
FIG. 8 is a sectional view illustrating of the semiconductor device of RC-IGBT structure according to a third embodiment of the present disclosure.

As shown in FIG. 8, in the embodiment, the pitch of the trench 6 of the IGBT part 100 is same as the pitch of the trench 6 of the FWD part 200. The opening width of the trench 6 of the FWD part 200, in other words, a distance between the both of wall face against each other is shorter than the opening width of the trench 6 of the IGBT part 100. As the opening width of the trench 6 of the FWD part 200 is shorter, it may be possible that the mesa width of the FWD part 200 is greater than the mesa width of the IGBT part 100.

Since the pitch of the trench 6 of the IGBT part 100 is set to be same as the pitch of the trench 6 of the FWD part 200, it may be possible that mesa width of the FWD part 200 is shorter than the mesa width of the IGBT part 100. In the case of the structure, it may be possible to achieve the effect as same as the first embodiment.

In the case of the present embodiment, the opening width of the trench 6 is changed. It may be possible to produce basically by the same manufacturing method of the semiconductor device including the structure of the first embodiment. In particular, only by change of the opening width of a mask when the trench 6 is provided, it may be possible to change the opening width of the trench 6. In regard to the others, it may be possible to produce the semiconductor device including the structure of the first embodiment.

(Fourth Embodiment)

A fourth embodiment of the present disclosure will be explained. The present embodiment includes change of the configuration of the trench 6 according to the first embodiment. The others of the embodiment are same as the first embodiment. Therefore, only a part different from the first embodiment will be explained.

Figure 9:
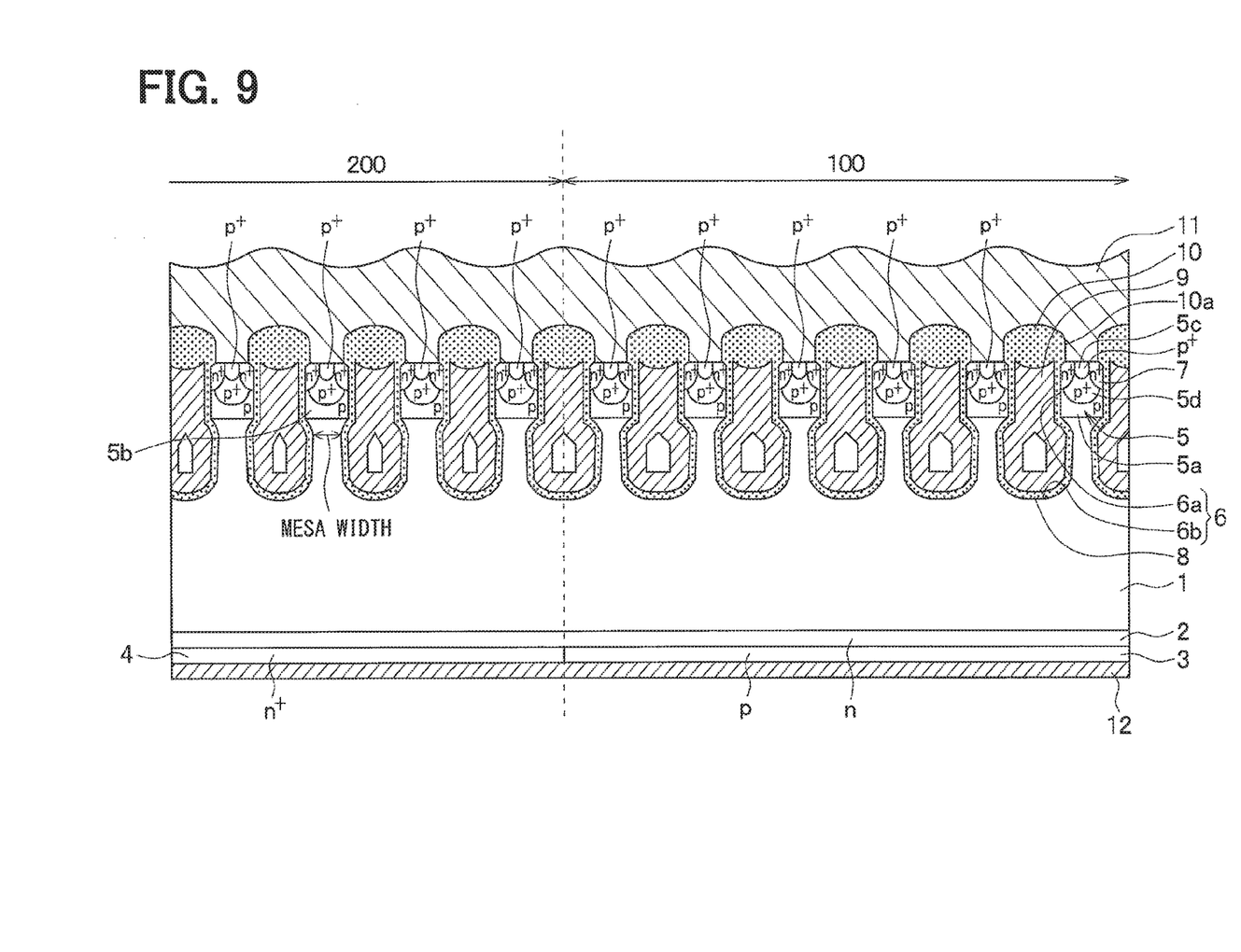
FIG. 9 is a sectional view illustrating of the semiconductor device of RC-IGBT structure according to a fourth embodiment of the present disclosure.

As shown in FIG. 9, in the embodiment same as the third embodiment, the pitch of the trench 6 of the IGBT part 100 is same as the pitch of the trench 6 of the FWD part 200. However, the opening width of the first trench 6a is same in the IGBT part 100 and in the FWD part 200. The opening width of the FWD part 200 is shorter than the opening width of the IGBT part 100. As the opening width of the second trench 6b of the FWD part 200 is shorter, it may be possible that the mesa width of the FWD part 200 is greater than the mesa width of the IGBT part 100

Since the pitch of the second trench 6b is set to be same in the IGBT part 100 and in the FWD part 200 and the opening width of the second trench 6b is changed, it may be possible that mesa width of the FWD part 200 is shorter than the mesa width of the IGBT part 100. In the case of the structure, it may be possible to achieve the effect as same as the first embodiment.

In the case of the present embodiment, the opening width of the second trench 6b is changed between the IGBT part 100 and the FWD part 200. It may be possible to produce basically by the same manufacturing method of the semiconductor device including the structure of the first embodiment. In particular, since a providing process of the trench 6 of the IGBT part 100 and the FWD part 200 are performed severally. Therefore, the opening width of the second trench 6b may be controlled independently. In regard to the others, it may be possible to produce the semiconductor device including the structure of the first embodiment.

(Other Embodiments)

The present disclosure is not limited to the embodiments described above, and can be modified as appropriate.

For example, as the shape of the trench 6, it is described as an example as the shape of the pot shape that includes the first trench 6a and the second trench 6b including the opening width that is greater than the first trench 6a, and the shape, which includes the opening width that is almost constant. These are examples showing the shape of the trench 6. In the case of the structure set to include the mesa width of the FWD part 200 that is equal to or more than 0.3 μm, it may include a difference as the shape of the trench 6 and the shape of the other configuration elements.

In each of the embodiments, it is explained as an example as IGBT of the n channel type that a first conductivity type is the n type and a second conductivity type is the p type. However, the disclosure can be applied to IGBT of the p channel type that each of the configuration elements is reversed.

The invention claimed is:

1. A semiconductor device in which an IGBT part where a vertical type IGBT is provided and a diode part where a diode is provided, the diode part being provided along the IGBT part, are provided together into a single chip, the semiconductor device comprising:
    a drift layer that has a first conductivity type;
    a corrector region that has a second conductivity type and is provided in a back face side of the drift layer in the IGBT part;
    a cathode region that has the first conductivity type and is provided in the back face side of the drift layer in the diode part;
    a second conductivity type region that is provided in both of the IGBT part and the diode part at a surface layer part of a front face side of the drift layer;
    a plurality of trenches that are arranged in the IGBT part and in the diode part, by being provided deeper than the second conductivity type region to divide the second conductivity type region into a plurality of pieces, configure a channel region by at least part of the second conductivity type region in the IGBT part, and configure an anode region by the second conductivity type region in the diode part;
    an emitter region that has the first conductivity type and is provided along a side face of each trench in a surface layer of the channel region in the IGBT part;
    a gate insulation film that is provided in a surface of each trench;
    a gate electrode that is provided in a surface of the gate insulation film;
    an upper electrode that is electrically connected with the second conductivity type region in the IGBT part and is electrically connected with the anode region; and
    a lower electrode that is electrically connected with the corrector region in the IGBT part and is electrically connected with the cathode region in the diode part, wherein:
    a width of a part where a distance between the plurality of trenches is narrowest in the drift layer of the diode part is defined as a mesa width of the diode part;
    the mesa width of the diode part is set to be equal to or greater than 0.3 μm
    a width of a part where a distance between the plurality of trenches is narrowest in the drift layer of the IGBT part is defined as a mesa width of the IGBT part; and
    the mesa width of the diode part is set to be wider than the mesa width of the IGBT part.

2. The semiconductor device according to claim 1, wherein:
    each trench includes:
        a first trench corresponding to an inlet opening side, and
        a second trench that communicates with the first trench, the second trench having an opening width corresponding to a distance of side walls facing each other that is wider than an opening width of the first trench, a bottom part of the second trench being positioned in the drift layer; and
    the mesa width of the diode part is a distance between second trenches in the diode part.

3. The semiconductor device according to claim 2, wherein:
    the mesa width of the IGBT part is a distance between second trenches in the IGBT part; and
    the mesa width of the IGBT part is set to be equal to or less than 0.3 μm.

4. The semiconductor device according to claim 1, wherein:
    each trench includes:
        a first trench corresponding to an inlet opening side, and
        a second trench that communicates with the first trench, the second trench having an opening width corresponding to a distance between side walls facing each other that is longer than an opening width of the first trench, a bottom part of the second trench being positioned in the drift layer;
    the mesa width of the diode part is a distance between second trenches in the diode part;
    the mesa width of the IGBT part is a distance between second trenches in the IGBT part; and
    the mesa width of the diode part is set to be different from the mesa width of the IGBT part.

5. The semiconductor device according to claim 1, wherein:
    a shape of each of the plurality of the trenches is identical in both the IGBT part and the diode part; and
    a pitch at which the plurality of the trenches in the diode part are positioned is set to be greater than a pitch at which the plurality of the trenches in the IGBT part are positioned.

6. The semiconductor device according to claim 1, wherein:
    a pitch at which the plurality of trenches are positioned is set to be identical in the IGBT part and in the diode part; and
    regarding an opening width of the distance between side walls facing each other in a trench, an opening width of each trench in the diode part is set to be shorter than an opening width of each trench in the IGBT part.

7. The semiconductor device according to claim 2, wherein:
- a pitch at which the plurality of trenches are positioned is set to be identical in the IGBT part and in the diode part; and
- regarding an opening width of a second trench, the opening width of each second trench in the diode part is set to be shorter than an opening width of each second trench in the IGBT part.

8. The semiconductor device according to claim 1, wherein:
- the mesa width of the diode part is set from 0.3 μm to 0.8 μm.

\* \* \* \* \*